United States Patent
Holcombe (12)

(10) Patent No.: US 6,281,486 B1
(45) Date of Patent: Aug. 28, 2001

(54) OFF-AXIS IMAGE CORRECTION WITH SPACED PHOTODETECTORS

(75) Inventor: Roger S. Holcombe, Santa Barbara, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/233,639

(22) Filed: Jan. 19, 1999

Related U.S. Application Data (63) Continuation-in-part of application No. 08/819,405, filed on Mar. 17, 1997, now Pat. No. 5,864,132.

(51) Int. Cl.$^7$ ................................................. H01L 27/00
(52) U.S. Cl. .................................. 250/208.1; 250/208.2; 250/214.1; 250/216
(58) Field of Search .......................... 250/208.1, 208.2, 250/214.1, 216, 214 R; 359/95

(56) References Cited

U.S. PATENT DOCUMENTS 5,400,161 * 3/1995 Lambert, Jr. .......................... 250/216
5,665,963 * 9/1997 Campbell ........................... 250/208.1

* cited by examiner

Primary Examiner—Stephone B. Allen
(74) Attorney, Agent, or Firm—William C. Schubert; Glenn H. Lenzen, Jr.

(57) ABSTRACT

An optical device is positioned to receive an image and to deflect it into spatially separate portions onto the mutually spaced photosensitive surfaces of an array of staring array detectors. The optical device, which can be implemented with prisms or mirrors, directs the deflected light portions only onto the photosensitive portions of the array, avoiding non-photosensitive gaps between the photodetectors. The focal surface of the optical device may be nonplanar, and in that case the photosensitive portions of the array are positioned to lie at the nonplanar focal surface. The portions of the image received by the individual photodetectors combine to form the overall image.

20 Claims, 8 Drawing Sheets

OFF-AXIS IMAGE CORRECTION WITH SPACED PHOTODETECTORS

This application is a continuation-in-part of allowed application Ser. No. 08/819,405, filed Mar. 17, 1997, now U.S. Pat. No. 5,864,132, for which priority is claimed and whose disclosure is incorporated by reference.

BACKGROUND OF THE INVENTION

1. Field of the Invention

This invention relates to photodetection of images, and more specifically to optical devices for enhancing the quality of images detected by multiple staring detector arrays.

2. Description of the Related Art

A Staring Array Detector (SAD) is a real-time photodetection device which includes solid state optical sensors for converting optical energy into electrical signals. The SAD has a photodetector with a photosensitive surface made up of an array of semiconductor pixels that sense brightness, darkness, and grey tones. Light from an image focused onto the pixels is continually processed by a Readout Integrated Circuit (ROIC) to produce electrical signals representing the intensity of the light. An image is formed by combining the electrical signal from each pixel. The resolution of the image detected by a SAD depends on the size of each pixel, with smaller pixels providing greater resolution. Pixel sizes achieved to date are as small as approximately 400 square micrometers. The size of the image detected, on the other hand, depends on the size of the array, which in turn depends on the size and number of the pixels in each array.

The SADs that have a large array of pixels, on the order of 1028×1028 pixels, have the advantage of providing a large surface for image detection. One such SAD is the Aladan Array, manufactured by Raytheon Systems Co. The problem with a large array of pixels is that it has complex circuitry and is expensive to manufacture. One solution to forming a large but less expensive detection surface, or to forming a larger than conventional array, is to place several SADs in contact next to one another with their edges abutting. The combination of the SADs' individual photodetectors provides a large photodetection surface. The problem with this solution, referred to as the edge-butting SAD, is that the ROIC of each SAD forms a boundary surrounding its photodetector. When two SADs are placed next to one another, their ROICs, which have no photosensitive properties, form a non-photosensitive gap between their photodetectors. The gaps cause discontinuities in the image detected, resulting in poor image detection.

One solution which avoids the gaps between the photodetectors of the edge-butting SADs is a SAD that has its ROIC formed only beneath its photodetector surface. One such SAD is the Edge-Butted Array, manufactured by Raytheon Systems Co. The photodetectors of these SADs can contact one another with no ROIC between them, thus eliminating any gaps in the image detected. This approach, however, may be costly and difficult to manufacture.

Another method of image detection using SADs is to form a narrow array of pixels and mechanically move the array across an image to be detected. At each location a portion of the image is detected, and all of the image portions are then combined to form the overall image. One such detector is the BSTS, manufactured by Raytheon Systems Co. The problem with this type of image detector is that it does not provide real-time image detection. At each instant of time, only a portion of an image is detected. If the image changes between two detection locations, portions of two different images are detected, which when combined produce an inaccurate detection of either image.

SUMMARY OF THE INVENTION

The present invention comprises an image detector including a novel optical device that eliminates the gaps formed in the imaged detected by edge-butting SADs and provides a low cost and easily manufactured solution to the problem of creating large SAD photodetection surfaces.

The optical device includes a deflector that is positioned to receive light from an image that is focused by an imager and to spatially deflect the incoming light into large portions which are received by the SADs' photodetectors. The deflector directs the spatially deflected image portions only onto the SADs' photodetectors, avoiding the gaps between the photodetectors. The combination of the image portions received by the photodetectors forms the overall image received by the deflector. The optical device has a nonplanar focal surface, and the multiple photodetectors are positioned such that each photosensitive detector surface lies at the nonplanar focal surface.

In one embodiment the deflector includes multiple prisms, equal to the number of SADs and positioned to deflect the image portions onto respective SAD detectors. In another embodiment multiple mirrors are used instead of prisms.

DETAILED DESCRIPTION OF THE INVENTION

Figure 1A:
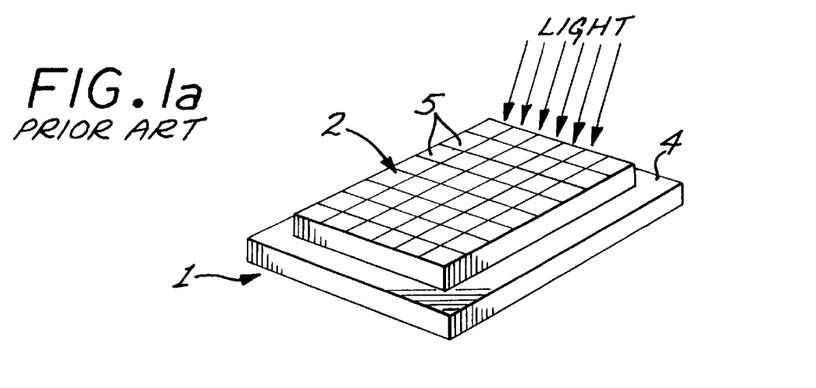
FIG. 1a is a simplified perspective view of a conventional staring array detector (SAD) with its photosensitive detector positioned over its readout integrated circuitry (ROIC)

FIG. 1a is a simplified perspective view of a conventional SAD 1 which encodes an optical image onto an electrical signal. The SAD 1 includes an optical photodetector 2 which has a photosensitive surface and is positioned on top of a wide ROIC board 4. The photosensitive surface of the photodetector 2 is made up of rows and columns of photosensitive semiconductor pixels 5. The pixels receive optical energy and provide electrical signals the ROIC, which encodes them into an electrical signal for subsequent reconstruction as an image. An example of a SAD is the 480×640 InSb VISMIR (visible through mid-wave infrared) Focal Plane Array manufactured by Raytheon Systems Co, with pixel dimensions of 20 micrometers by 20 micrometers.

Figure 1B:
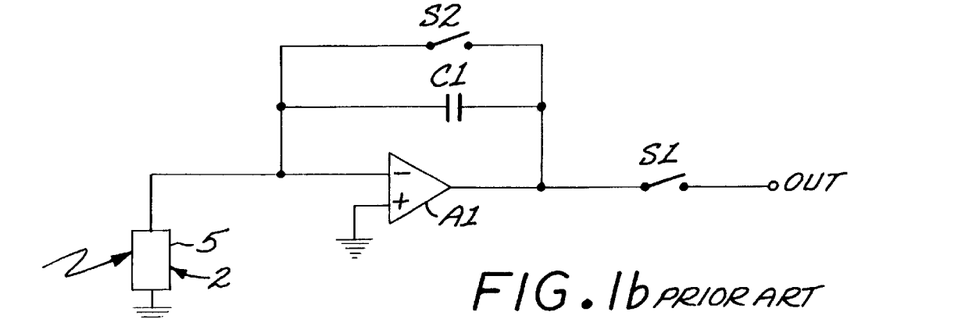
FIG. 1b is an electrical schematic circuit diagram of part of the ROIC and SAD which converts the optical energy received by a pixel in the SAD's photodetector into electrical energy.

FIG. 1b is a simplified electrical schematic diagram of part of the ROIC circuitry which converts the optical energy received by each pixel of the SAD into an electrical signal.

The output of the system is a series of short images of the focuses image of the viewed scene, similar to moving pictures. Electronic sampling of the voltage level of each photodetector element (pixel 5) is used to produce an electronic image of the viewed scene. The voltage of each pixel 5 corresponds to the light intensity of that portion of the focused image. When reconstructed in a display, the individual pixels form a complete picture.

The basic operation consists of the infrared energy illuminating one pixel 5 of the photosensitive diode photodetector 2, which in turn generates electrical current. Commonly used materials for a photodetector include alloys of indium antimonide or mercury cadmium tellurium. This current flows to a storage capacitor C1 which increases in voltage level according to the intensity of the illumination and to the sampling time. The voltage of the capacitor C1 is measured to form the intensity level of the appropriate display picture.

However, a limitation in the characteristics of the photodetector 2 requires additional circuitry to accomplish the desired operation. The photodetector may be thought of as a current generator with limited voltage generating capability. Beyond a certain voltage, the photodetector breaks down and the generated energy flows to ground. Circuitry is required to permit higher voltage levels to be delivered to the capacitor C1.

The illustrated circuit of FIG. 1b uses a capacitive feedback transimpedance amplifier (CTIA) A1. This illustrated CTIA is typical of several circuits that overcome the voltage limits of the photodetector 2 by providing an infinite impedance load with a virtual ground to the photodetector output. A switch S1 is connected between the amplifier output and an output terminal T1, and another switch S2 is connected in parallel with the capacitor C1 across the amplifier's input and output.

In operation, with both switches open, focused infrared scene energy is directed to the photodetector 2, which generates electrical current. The current flows to the capacitor C1, which increases in voltage proportional to the incoming radiant intensity and time duration. The amplifier A1 provides the voltage to the capacitor C1 in excess of the breakdown voltage of the photodetector 2.

At the end of the sampling period, switch S1 is closed and the voltage is measured by conventional processing circuitry, which combines it with signals from the rest of the array to produce the desired picture. Following this readout, the switch S2 is closed, shorting the capacitor to zero volts. Both switches are reopened and the sampling cycle is repeated. Conventional switch timing and control circuitry may be used for this purpose.

Figure 2:
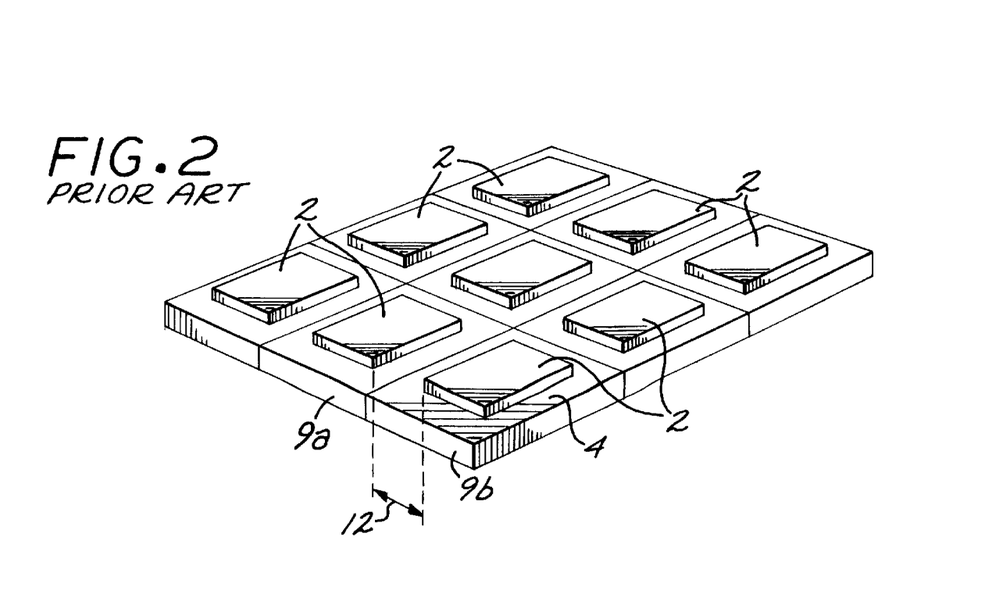
FIG. 2 is a perspective view of a configuration of none SADs positioned on a single plane with edge-butting ROIC boards.

FIG. 2 is a perspective view of nine SADs 2 positioned in contact on a single plane with the edges of their ROIC boards 4 butting. The detection surface is therefore the combination of the surface area of all of the photodetectors 2. This segmentation of the SAD is a common practice because it is expensive and difficult to manufacture a SAD with a large detection surface. However, the limit to this approach, as stated above, is that the ROIC board 4 is not photosensitive, creating a gap in the detection of light that falls between two photodetectors 2. As an example, a gap 12 with non photosensitive properties or response is shown between two SADs 9a and 9b. Any portion of the incident image falling on the gap 12 is not detected and is therefore lost.

Up to this point, existing SAD technology has been described. The present invention includes a passive optical device (requiring no power) that is positioned to receive light from an image to be detected by edge-butting SADs and to spatially deflect it into image portions that land only upon the SAD's photodetectors. No portion of the incident image is lost. Wasted illumination of the non-photosensitive gaps created by the ROICs between the SADs' photodetectors is avoided. Among the ways to implement the desired spatial light deflection are optical devices using multiple prisms or multiple mirrors (or a combination thereof), discussed below.

Figure 3:
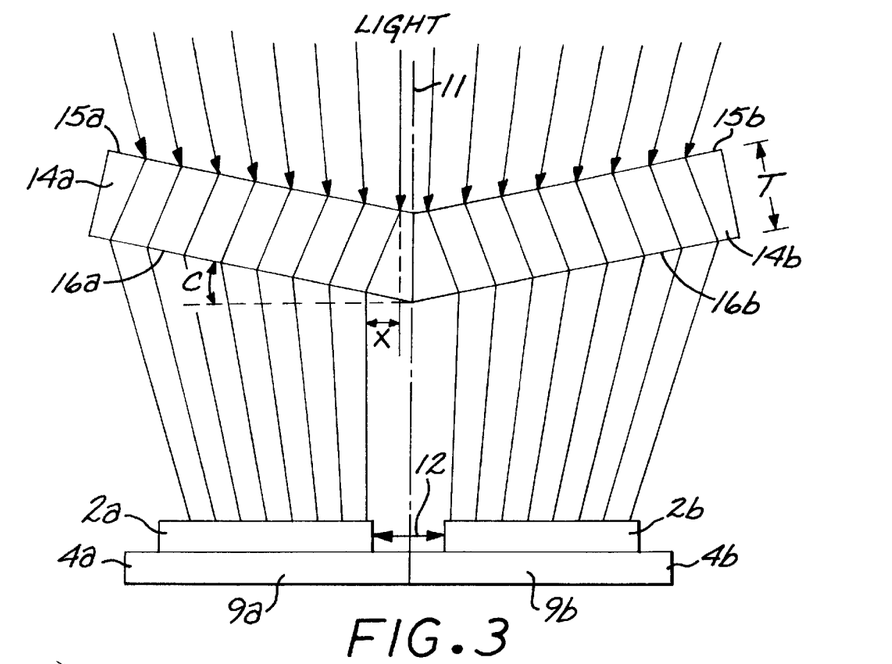
FIG. 3 is an elevational view of an image detector in accordance with the present invention implemented with two prisms which are positioned over two edge-butting SADs.

Referring to FIG. 3, the two SADs 9a and 9b from FIG. 2 shown with ROIC boards 4a and 4b and the gap 12 between their respective photodetectors 2a and 2b. In this figure the optical device of this invention is implemented with two prisms 14a and 14b. The prisms are transparent parallelograms made of a material such a germanium that is transparent to the wavelength of interest. The prisms 14a and 14b have respective light-receiving surfaces 15a and 15b which are parallel to their respective light-exiting surfaces 16a and 16b. The receiving surfaces 15a and 15b of the prisms receive incoming light from an image which has been focused by an imaging device. The imaging device, which is not shown, typically includes objective lenses or reflecting mirrors. The prisms spatially deflect the incoming light through refraction without separating it spectrally according to wavelength, with the light exiting from surfaces 16a and 16b. This spatial deflection introduces an optical path length difference into the path of light rays incident upon the prisms, such that a light ray leaving the prism is offset from its point of entrance. The offset can be established to position the light rays exiting the prisms to avoid any gaps and land only upon the SADs' photodetectors 2a and 2b. For example, a ray of light leaving prisms 14a at surface 16a is offset by a distance X from its point of entrance at surface 15a. By establishing the amount of offset, a ray of light can be positioned to land only on a photodetector, such as photodetector 2a of SAD 9a, instead of on the non-photosensitive gap 12. Thus, a ray of light that without the prisms would land on gap 12, is instead deflected by the prisms 14a and 14b to impinge upon a photodetector 2a or 2b.

The offset distance X is preferably established at half the width of the gap 12. Among the factors that affect the offset distance are the index of refraction of the prism, the angle C of the prism's exit surface 16a with respect to the surface of the photodetector 2a, the prism thickness W (its optical prescription), and the width of the gap 12 between two photodetectors.

Figure 4:
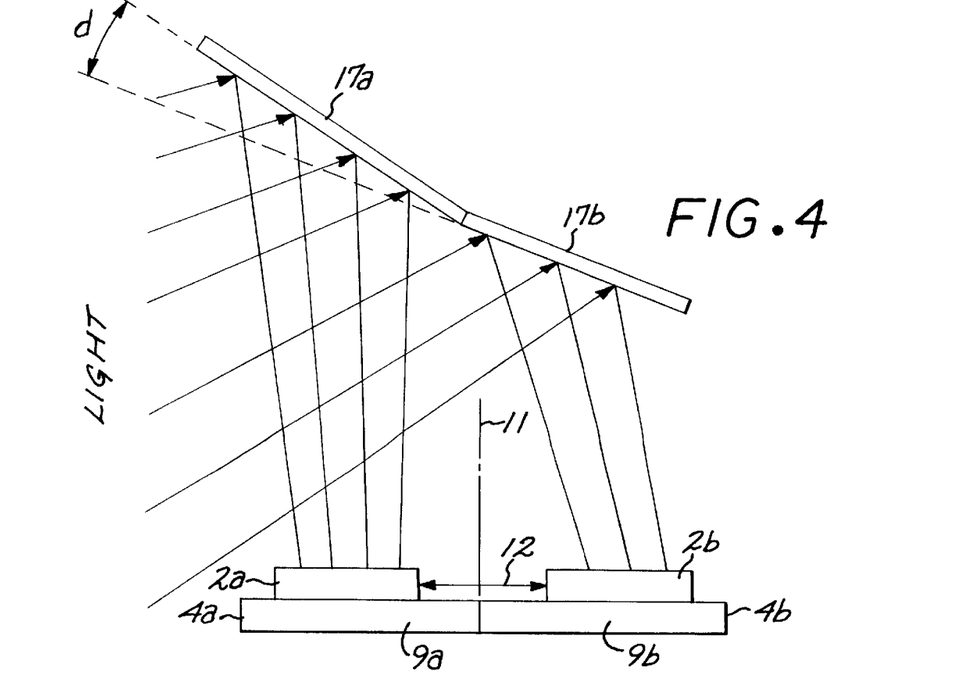
FIG. 4 is an elevational view of an alternative embodiment in which two mirrors are positioned over two edge-butting SADs.

For a SAD to detect an image, incoming rays must be focused such that the imaging plane lies on the surface of the SAD's photodetector. Typically in the prior art, an imaging device focuses an image directly onto the surface of a photodetector. The introduction of the prisms 14 of the present invention into the light path from the imaging device to the surface of a photodetector 2 changes the optical path length of the rays provided by the imaging device. Therefore, the photodetector surfaces must be adjusted up or down to accommodate for this change in the optical path length of the focused light provided by the imaging device. If the thickness T of the prisms is uniform and the image provided by the imagery falls on a single plane, then the photodetectors can be positioned on a single plane, as illustrated in FIGS. 3–4.

Figure 5:
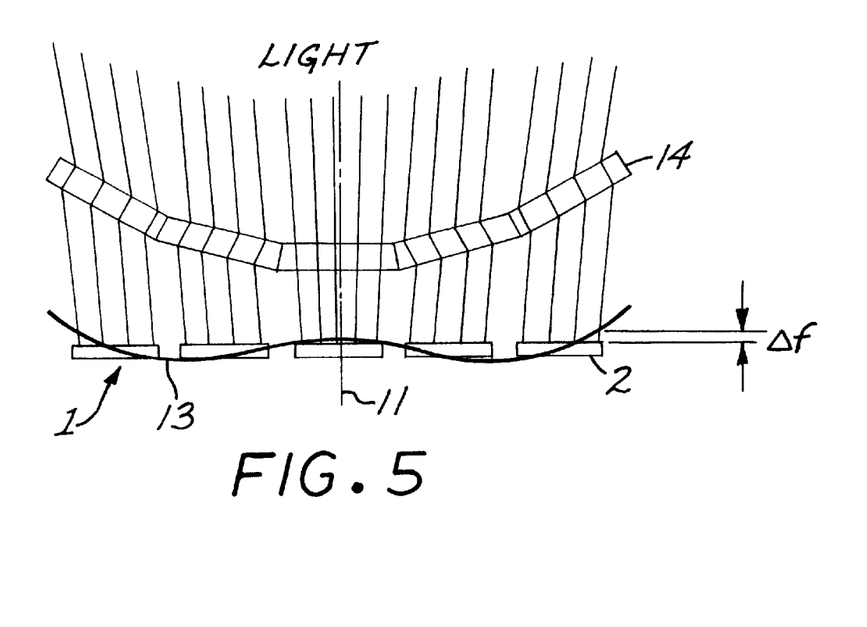
FIG. 5 is a schematic elevational view of an image detector wherein the focal surface is non-planar, causing an out-of-focus condition at the photodetectors.

However, it sometimes is the case that the focal surface of the image passed through the focusing optics and through the optical device of the prisms is non-planar. This effect is of particular concern for wide-angle detectors, as illustrated in FIG. 5. A focal surface 13 of the image of the optical device does not lie on a plane, but instead has a nonplanar surface, illustrated as a shallow "W" form that is sometimes observed. (The "focal surface" as used herein corresponds in meaning to the "focal plane" of conventional optics terminology, but is not a pure "plane" due to the focusing optics and the prism.) Consequently, the image on the photodetector 2 is out of focus by as much as Δf, which out-of-focus condition can vary across the surface area of any one photodetector 2. To overcome this problem, either the photodetector may be repositioned so that their upper surfaces lie as closely coincident to the focal surface 13 as possible, or the thickness of the prisms 14 may be changed to focus the non-planar image on a single plan on which the photodetector surface lies. Each prism and its respective photodetector may be manipulated by conventional mechanisms independently of other prisms and their photodetectors. Of these possible solutions, repositioning of the photodetectors is preferred for its ease of implementation.

Figure 6:
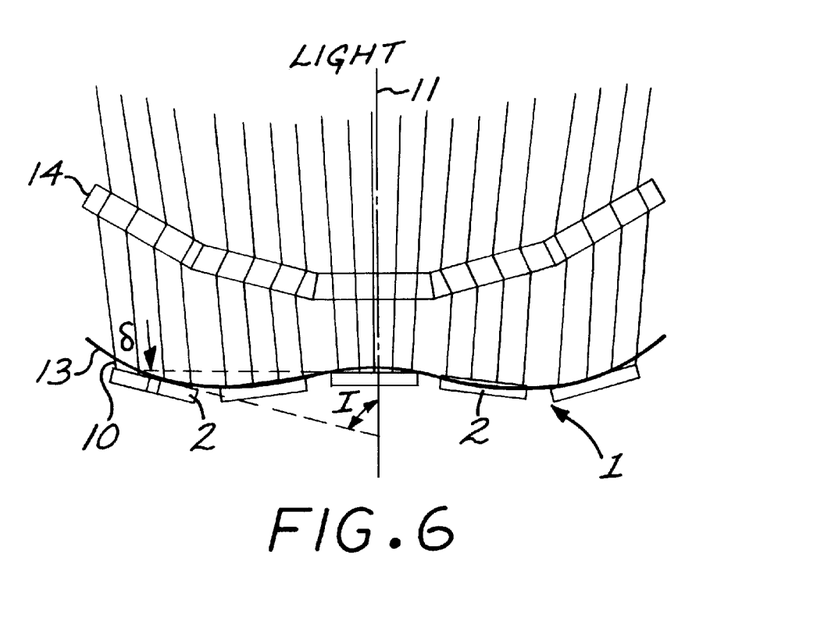
FIG. 6 is a schematic elevational view of the image detector of FIG. 5, with the photodetectors positioned to lie along the focal surface.

FIG. 6 illustrates the positioning of the photodetectors 2 so that their photosensitive surfaces lie closely coincident with and tangential to the focal surface 13. The photodetectors 2 may be repositioned either angularly or translationally. In angular repositioning, the angle I of the photosensitive surface 10 of the photodetector 2 relative to an optical axis 11 of the detector 1 is changed from the 90 degrees illustrated in FIG. 5 to a greater or smaller angle. Usually, the angle I will have only a small deviation from 90 degrees, such as ±5 degrees or less, but the deviation is exaggerated in some parts of FIG. 6 for purposes of illustration. The angular repositioning or reorienting may occur in two components in a three-dimensional system, although only a single component I is illustrated in the two-dimensional depiction of FIG. 6. The translational repositioning involves the displacement of the photosensitive surface parallel to the optical axis 11 of the detector 1, in either direction, by an amount δ illustrated in FIG. 6. Stated equivalently, at least one of the multiple photodetectors may be oriented relative to the optical axis 11 of the detector 1 at an angle other than 90 degrees, and at least one of the photodetectors may be displaced from another one of the photodetectors by a displacement parallel to the optical axis 11 of the detector 1. Both repositionings are utilized for most of the photodetectors. The planar SAD of FIG. 3 is recognized as a special case of FIG. 6, with I and δ both zero for each photodetector.

The positioning of the photosensitive surfaces 10 of the individual photodetectors 2, as illustrated for five photodetectors in FIG. 6, allows most of the area of the photosensitive surface 10 to lie closely coincident with the focal surface 13. A perfect match along the entire photosensitive surface 10 of each photodetector 2 is often not possible because the focal surface 13 is curved and the surface 10 is flat, but the present approach permits a close approximation to be achieved.

Figure 7:
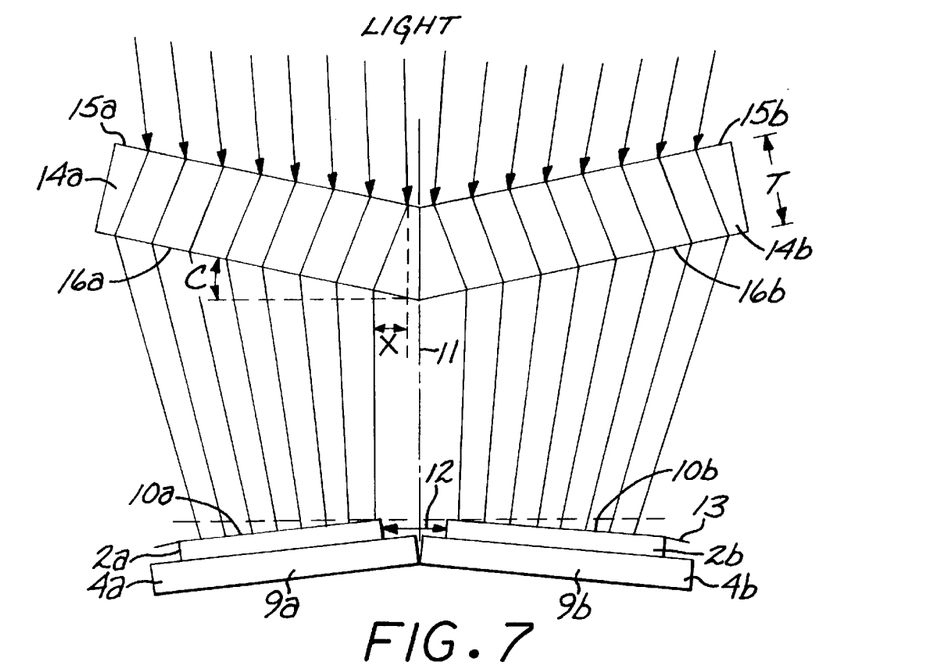
FIG. 7 is an elevational view of the image detector of FIG. 3 with photodetectors positioned along a nonplanar focal surface.

FIG. 7 illustrates the optical system of FIG. 3, except altered by positioning the detectors 9a and 9b according to the above-described approach. The necessity of repositioning of the detectors depends on several factors, including, for example, the width of the image and the focusing optics.

FIG. 4 is a view of the optical device in accordance with the present invention implemented with two mirrors 17a and 17b. SADs 9a and 9b are the same as the SADs 9a and 9b shown in FIG. 2. Mirrors are used instead of prisms to spatially deflect incoming light from an imaging device onto the photodetectors' surfaces, without separating the light spectrally according to wavelength. Each SAD has a corresponding mirror, with mirrors 17a and 17b reflecting images onto the photodetectors 2a and 2b of SADs 9a and 9b, respectively. The angle d between mirrors 17a and 17b causes the incoming rays to be deflected only onto the SADs' photodetectors 2a and 2b, respective, avoiding the gap 12 between them. Furthermore, the distances between the SAD's photodetector surfaces and their respective mirrors are established such that the focused light received by the mirrors is reflected to land in focus on their respective photodetector surfaces.

Figure 8:
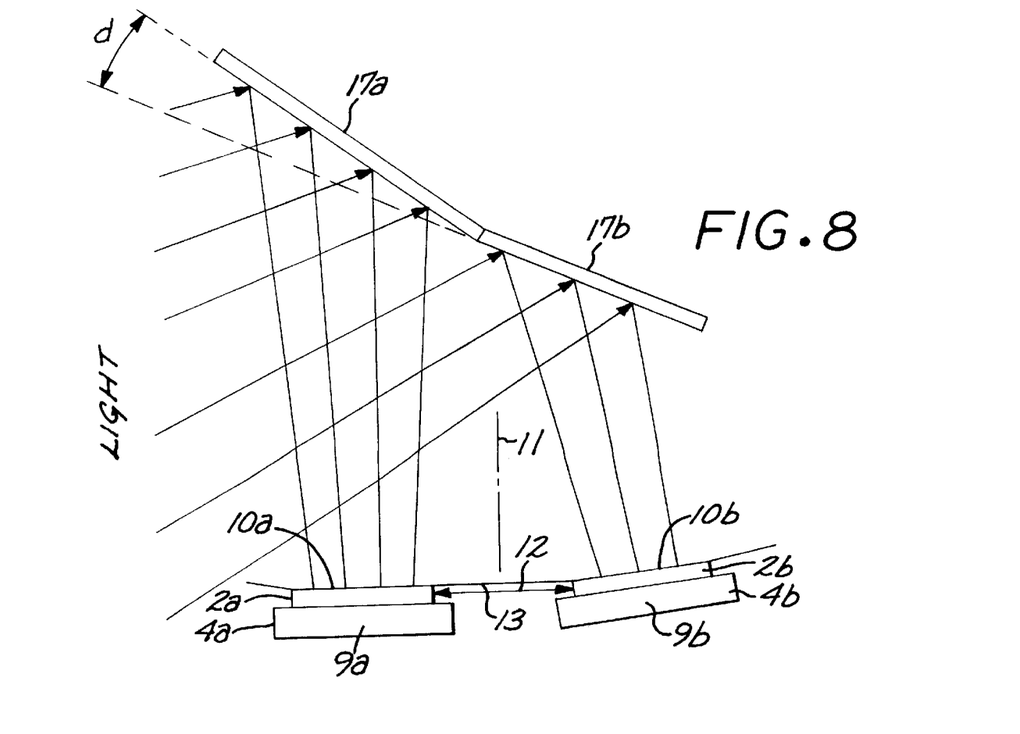
FIG. 8 is an elevational view of the image detector of FIG. 4 with detectors positioned along a nonplanar focal surface.

The same non-planarity of the focal surface, as discussed above in relation to the embodiment of the invention implemented by prisms shown in FIGS. 3 and 5–7, may be experienced for the embodiment implemented by mirrors, illustrated in FIG. 4. FIG. 8 depicts the same mirror-implemented embodiment as shown in FIG. 4, except with the photosensitive surfaces 10a and 10b of the detectors 9a and 9b positioned to lie along a focal surface 13. The same angular and displacement repositionings may be utilized with the mirror-implemented embodiment, as illustrated in FIG. 8.

Adjustments may also be achieved by moving the mirrors 17 up or down with respect to the surface of the photodetectors, although this is more difficult to do. Unlike prisms, mirrors do not change the optical path length of the light rays they receive.

Figure 9:
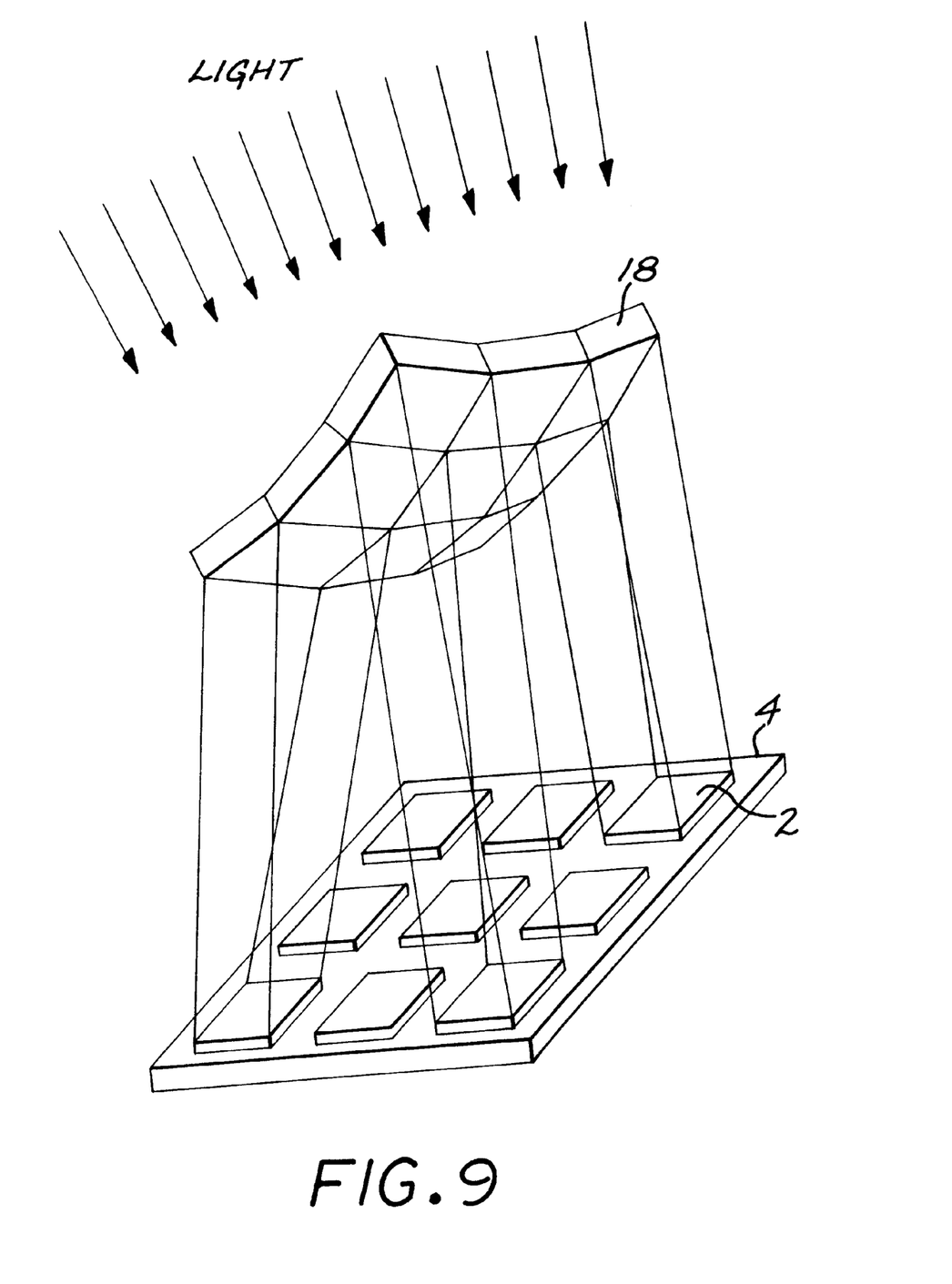
FIG. 9 is a perspective view of a configuration of nine prisms positioned to direct an incoming image onto the photodetectors of the nine edge-butting SADs shown in FIG. 2.

FIG. 9 is a perspective view of a configuration of nine prisms positioned to direct focused light from an image provided by an imaging device onto the photodetectors of the nine edge-butting SADs shown in FIG. 2. The prisms 18 are positioned in an array which is concave with respect to the photodetectors to spatially deflect the incoming focused light into portions which are received by respective photodetectors 2. The gaps between the photodetectors 2 do not receive any of the image, which is fully detected by the photodetectors 2. The pattern of configuring the prisms can be varied according to the arrangement of photodetectors 2, with a respective prism for each photodetector. The photodetectors 2 may also be angularly (angle I) or displacively (dimension δ) positioned to conform to a nonplanar focal surface, as discussed previously.

Figure 10A:
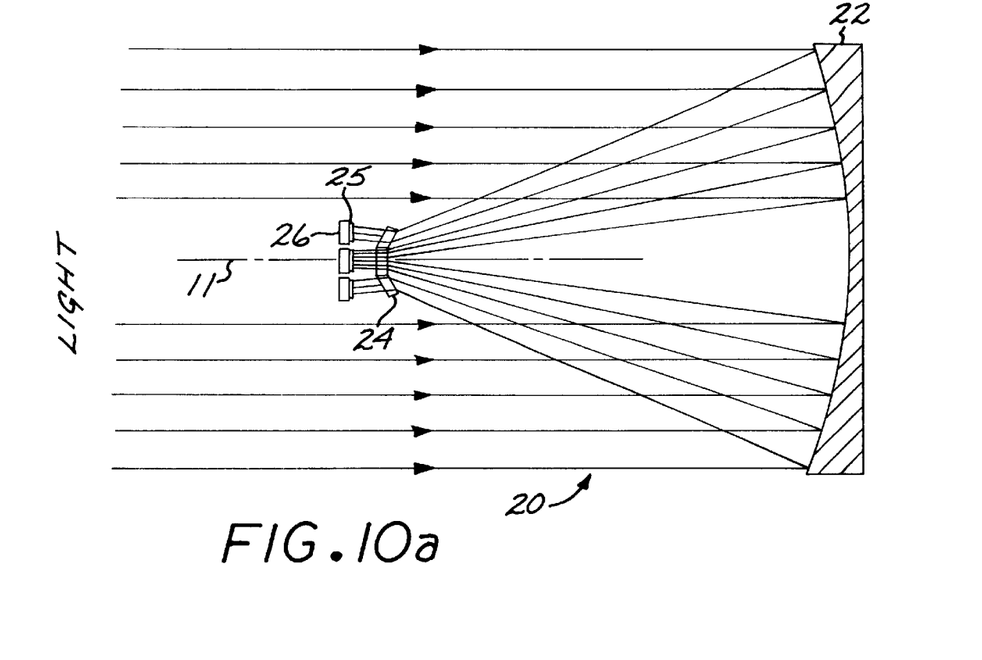
FIG. 10a is an optical diagram of a telescope with a reflecting mirror in which the present deflector implemented with prisms may be used.

FIG. 10a is an optical diagram of a telescope 20 which incorporates the optical device of the present invention. The telescope 20 includes a reflective mirror 22 as an imaging device that receives and focuses parallel unfocused light rays provided from an object such as a planet. A configuration of prisms 24 receives the focused light and distributes it in portions onto respective photodetectors 25 of a set of edge-butting SADs 26. Nine prisms as described in reference to FIG. 9 could be used. The photodetectors 25 are positioned to receive the focused image on their surfaces such that the gaps between them are avoided. The combination of the image portions received by the photodetectors 25 forms the overall image received by the prisms 24. The photodetectors 25 may also be angularly (angle I) or displacively (dimension δ) positioned to conform to a nonplanar focal surface, as discussed previously and illustrated in FIG. 10a.

Figure 10B:
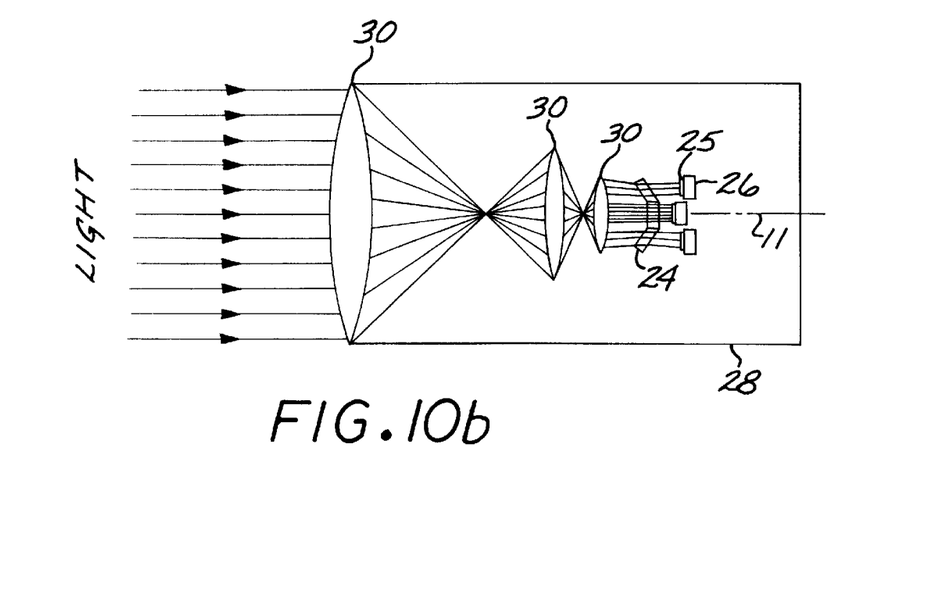
FIG. 10b is an optical diagram of a telescope with optical lenses which create an image suitable for detection by the deflector of the present invention implemented with prisms.

FIG. 10b is an optical diagram of another telescope 28 incorporating the present invention. The imaging device of the telescope 28 is a set of objective lenses 30 that demagnify and focus incoming parallel light rays. This focused light is received by a configuration of prisms 24 which spatially distributes the light in portions onto the photodetectors 25 of a set of edge-butting SADs 26 as described above in reference to FIG. 10a. The photodetectors 25 may also be angularly (angle I) or displacively (dimension δ) positioned to conform to a nonplanar focal surface, as discussed previously and illustrated in FIG. 10b.

Figure 11A:
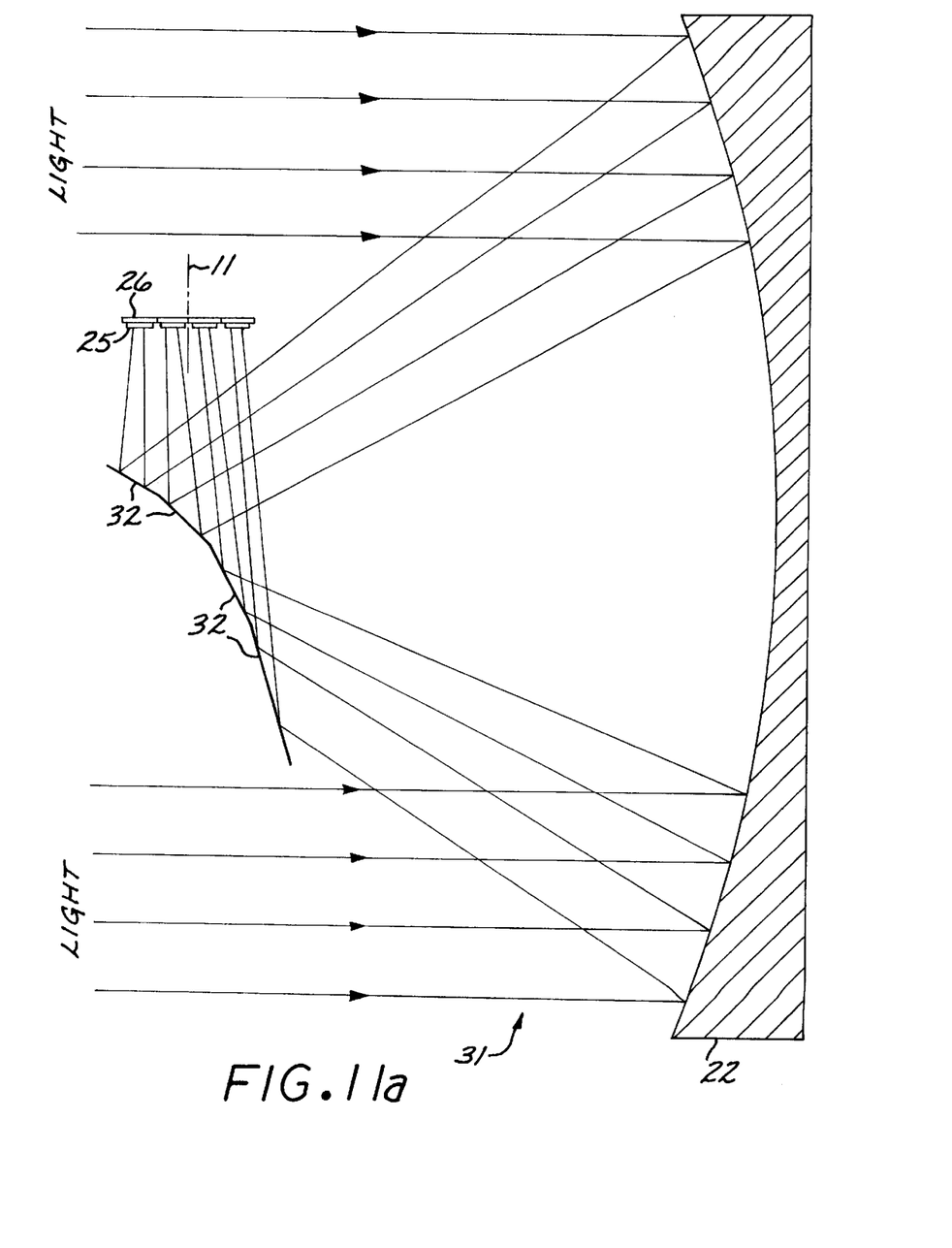
FIG. 11a is an optical diagram of a telescope with a reflecting mirror in which the present deflector implemented with mirrors may be used.

FIG. 11a is an optical diagram of a telescope 31 which focuses incoming parallel light rays using a reflecting mirror 22. The focused light is received by a configuration of mirrors 32 which are arranged in an array that is convex with respect to the photodetectors 25 of a set of edge-butting SADs 26 to reflect the light into portions that land on respective photodetectors 25. Normally one mirror would be provided for each photodetector, with the number of photodetectors depending upon the photodetector area required for the incoming image. FIG. 11a shows a simple configuration of four mirrors reflecting focused light onto four photodetectors 25. The image is received by the photodetectors in the manner described previously such that gaps between the photodetectors are avoided. The photodetectors 25 may also be angularly (angle I) or displacively (dimension δ) positioned to conform to a nonplanar focal surface, as discussed previously and illustrated in FIG. 11a.

Figure 11B:
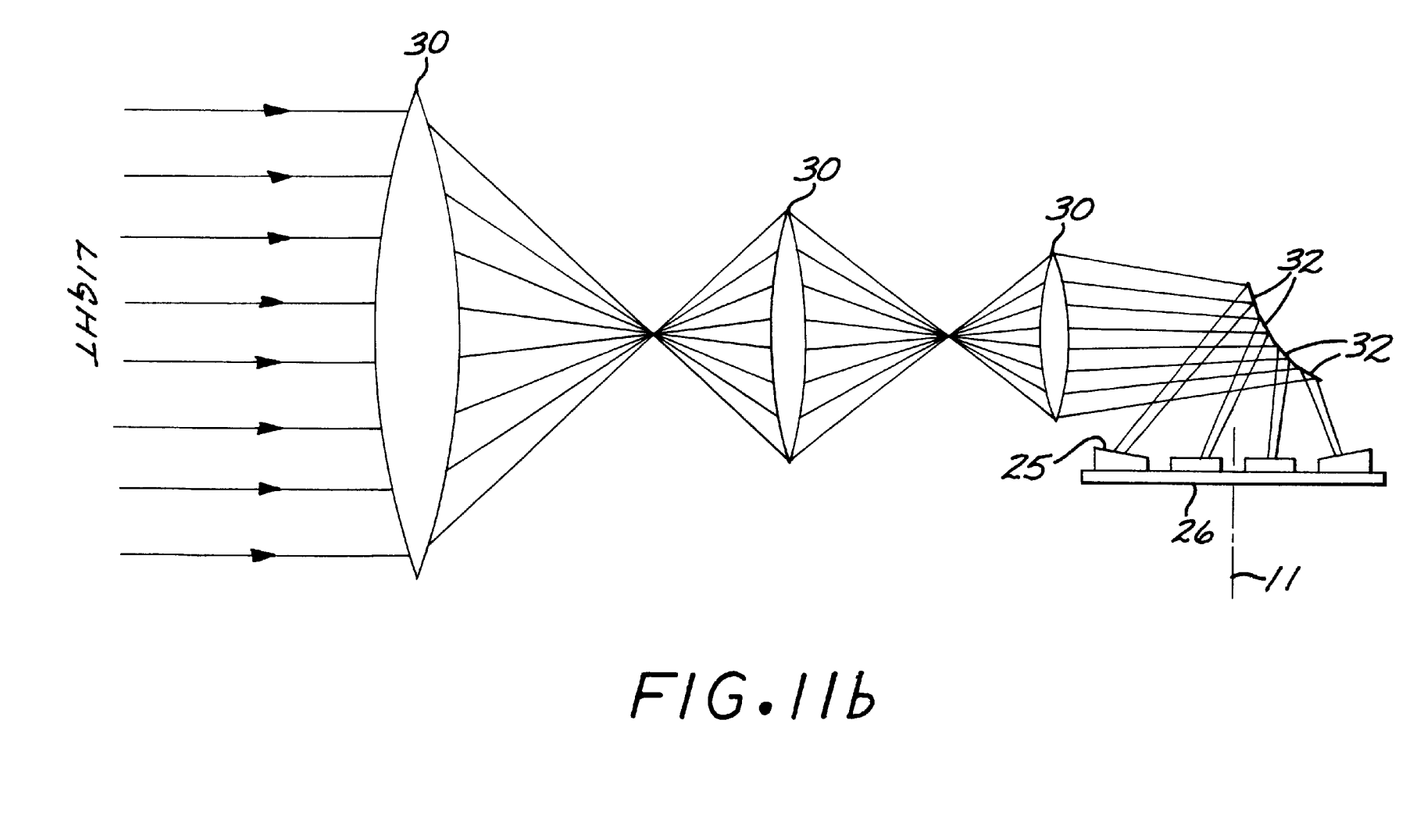
FIG. 11b is an optical diagram of a telescope with optical lenses which create an image suitable for detection by the deflector of the present invention implemented with mirrors.

FIG. 11b is an optical diagram of a telescope 33 that uses a set of objective lenses 30 to focus parallel light rays onto a configuration of mirrors 32. The mirrors 32, which are similar to the mirrors described in reference to FIG. 11a, reflect the incoming light onto the photodetectors 25 of a set of edge-butting SADs 26 as described above. The photodetectors 25 may also be angularly (angle I) or displacively (dimension δ) positioned to conform to a nonplanar focal surface, as discussed previously and illustrated in FIG. 11a.

While particular embodiments of the invention have been shown and described, numerous alternate embodiments will occur to those skilled in the art. For example, the optical device of the present invention can be implemented using holographs or binary optics, both devices functioning to direct incoming light rays away from gaps between SADs and onto their photodetectors. The energy measured can include all ranges of radiant energy from ultraviolet through long wave infrared. Furthermore, many types of detection surfaces can be used, such as photograph film, and they are not limited to those described above. Accordingly, it is intended that the invention be limited only in terms of the appended claims.

What is claimed is:

1. An image detector for detecting light from an image, comprising:

a detector comprising multiple photodetectors having respective mutually spaced photosensitive photodetector surfaces, and    an optical device positioned to receive light from an image and to direct said light in spatially separate portions, without separating the light spectrally, onto the respective photodetector surfaces, the combination of said light portions forming said image,    wherein the optical device has a nonplanar focal surface and the multiple photodetectors are positioned such that each photosensitive photodetector surface lies at the nonplanar focal surface.

2. An image detector as in claim 1, wherein said optical device comprises multiple prisms corresponding to said photodetectors, with said prisms positioned to deflect respective portions of said image onto respective photodetector surfaces of said photodetectors.

3. An image detector as in claim 2, wherein each prism comprises a transparent material and has one surface for receiving a portion of the image light and another surface, parallel to its light-receiving surface, from which that portion of focused light is directed to the detector surface of a respective photodetector.

4. An image detector as in claim 2, wherein said prisms are flat and angled to each other in a generally convex orientation with respect to said photodetectors.

5. An image detector as in claim 1, wherein said optical device comprises multiple mirrors corresponding to said photodetectors, with said mirrors positioned to reflect respective portions of said image onto respective detector surfaces of said photodetectors.

6. An image detector as in claim 5, wherein said mirrors are flat and angled to each other in a generally convex orientation with respect to said photodetectors.

7. An image detector as in claim 1, wherein said photodetectors comprise staring array detectors with photosensitive photodetector surfaces arranged in an array of pixels.

8. An image detector as in claim 1, wherein the detector has an optical axis, and wherein at least one of the multiple photodetectors is oriented relative to the optical axis at an angle other than 90 degrees.

9. An image detector as in claim 1, wherein the detector has an optical axis, and at least one of the photodetectors is displaced from another one of the photodetectors by a displacement parallel to the optical axis.

10. An image detector for receiving parallel unfocused light rays and detecting an image, comprising:

an imaging device for focusing said light rays into an image;

a plurality of photodetectors having respective mutually spaced photosensitive photodetector surfaces, and    an optical device positioned to receive said image and to direct it in spatially separate focused portions, without separating the light spectrally, onto respective photodetector surfaces of said photodetectors, the combination of said image portions forming said image,    wherein the optical device has a nonplanar focal surface and the multiple photodetectors are positioned such that each photosensitive photodetector surface lies at the nonplanar focal surface.

11. An image detector as in claim 10, wherein said photodetectors are positioned in edge-butting contact with each other and with respective photodetector surfaces separated by non-photosensitive gaps.

12. An image detector as in claim 11, wherein said deflected image portions are focused by said imaging device onto the photosensitive surfaces of said photodetectors, avoiding said gaps.

13. An image detector as in claim 10, wherein said optical device comprises respective prisms for said photodetectors, said prisms positioned between said imaging device and said photodetectors to deflect respective portions of said image onto said image portions.

14. An image detector as in claim 12, wherein said prisms are flat and angled to each other in a generally convex orientation with respect to said photodetectors.

15. An image detector as in claim 10, wherein said optical device comprises multiple mirrors for said photodetectors, said mirrors positioned to reflect respective portions of said image onto respective detector surfaces of said photodetectors.

16. An image detector as in claim 15, wherein said mirrors are flat and angled to each other in a generally convex orientation with respect to said photodetectors.

17. An image detector as in claim 10, wherein said imaging device comprises a telescope with a reflecting mirror which focuses parallel unfocused light rays into said image.

18. An image detector as in claim 10, wherein said imaging device comprises a telescope with objective lenses which focus parallel unfocused light rays into said image.

19. An image detector for detecting light from a continuous image, comprising multiple photodetectors having respective mutually spaced photosensitive photodetector surfaces that are separated from each other by gaps between said photodetector surfaces, an optical device positioned to receive a continuous pattern of light from a continuous image, to divide said continuous pattern of light into a plurality of spatially separated image portions, and to direct said mutually separated image portions onto respective ones of said photodetector surfaces so that substantially none of the light from said continuous image is directed onto the gaps between said photodetector surfaces, each image portion directed onto only a single corresponding photodetector surface, wherein the optical device has a nonplanar focal surface and the multiple photodetectors are positioned such that each photosensitive photodetector surface lies at the nonplanar focal surface.

20. An image detector for receiving parallel and substantially continuous unfocused light rays and detecting an image from said light rays, comprising:

an imaging device for focusing said light rays into a continuous image, a plurality of photodetectors having respective mutually spaced photosensitive photodetector surfaces that are separated from each other by gaps between said photodetector surfaces, and an optical device positioned to receive said continuous image, to device said continuous image into a plurality of mutually separated image portions, and to direct said mutually separated image portions onto respective ones of said photodetector surfaces so that substantially none of the light from said continuous image is directed onto the gaps between said photodetector surfaces, with each image portion directed onto only a single corresponding photodetector surface, wherein the optical device has a nonplanar focal surface and the multiple photodetectors are positioned such that each photosensitive photodetector surface lies at the nonplanar focal surface.

* * * * *